United States Patent [19]

Fukuta et al.

[11] Patent Number: 5,766,516
[45] Date of Patent: Jun. 16, 1998

[54] SILVER-BASED CONDUCTIVE PASTE AND MULTILAYER CERAMIC CIRCUIT SUBSTRATE USING THE SAME

[75] Inventors: Junzo Fukuta; Toshihiro Nakai, both of Nagoya, Japan

[73] Assignee: Sumitomo Metal (SMI) Electronics Devices Inc., Yamaguchi, Japan

[21] Appl. No.: 590,517

[22] Filed: Mar. 6, 1996

[30] Foreign Application Priority Data

Mar. 30, 1995 [JP] Japan ................................. 7-073536

[51] Int. Cl.$^6$ ................................................. H01B 1/22
[52] U.S. Cl. ................................. 252/514; 106/1.19
[58] Field of Search ............................. 252/514, 518; 106/1.19, 1.26; 420/510, 505

[56] References Cited

U.S. PATENT DOCUMENTS

| | | | |
|---|---|---|---|
| 4,051,074 | 9/1977 | Asada | 252/503 |
| 4,459,166 | 7/1984 | Dietz et al. | 156/89 |
| 5,045,141 | 9/1991 | Salensky | 156/240 |
| 5,417,745 | 5/1995 | Oprosky et al. | 106/13 |

FOREIGN PATENT DOCUMENTS

| | | |
|---|---|---|
| 60-24095 | 2/1985 | Japan. |
| 2-94595 | 4/1990 | Japan. |

*Primary Examiner*—Mark Kopec
*Attorney, Agent, or Firm*—Flynn, Thiel, Boutell & Tanis, P.C.

[57] ABSTRACT

A silver-based electrically conductive paste used for printing on green sheets of a low-temperature firable ceramic comprising a $CaO-Al_2O_3-SiO_2-B_2O_3$-system glass and $Al_2O_3$, wherein a silver-based powder in the conductive paste has a specific surface area in the range of 0.1 to 0.5 m$^2$/g and the formation of a scratch begins when the value measured with a grind gage for the paste containing an organic resin and an organic solvent is in the range of 30 to 10 μm. The silver-based conductive paste makes it possible to co-fire with a low-temperature firable ceramic substrate without causing the warping of the substrate and, therefore, is very useful for the formation of wiring conductors of internal layers of a multilayer circuit substrate of the low-temperature firable ceramic.

4 Claims, 2 Drawing Sheets

SILVER-BASED CONDUCTIVE PASTE AND MULTILAYER CERAMIC CIRCUIT SUBSTRATE USING THE SAME

BACKGROUND OF THE INVENTION

1. Field of the Invention

The present invention relates to a silver-based electrically conductive paste which is capable of preventing a substrate from warping during the course of sintering and usable for fine line printing for wiring, and a multilayer ceramic circuit substrate prepared using the paste.

2. Description of the Prior Art

In the production of a co-fired ceramic substrate wherein a green sheet is printed with a conductive paste and then fired, an increase in wire density, improvement in quality of the circuit substrate and fine line properties of the wire are demanded.

For example, when a silver-based electrically conductive paste is used as an internal layer wiring conductor paste for a low-temperature firable ceramic green sheet composed of a $CaO$—$Al_2O_3$—$SiO_2$—$B_2O_3$—system glass and $Al_2O_3$, the shrinkage percentage and shrinkage behavior during the firing of the silver-based paste are utterly different from those of the ceramic green sheet and, as a result, problems such as the warping and the formation of voids around the conductor are caused. Namely, the shrinkage percentage of the silver-based paste is not the same as that of the ceramic. When the shrinkage percentage of the silver-based paste is higher, a compressive stress is placed on the ceramic to deform the latter. A silver-based paste usually available on the market starts to shrink at about 400° C., while the ceramic green sheet starts to shrink at a higher temperature, and the difference between them is significant. In such a case, the silver-based conductor forms a considerably denser film before the ceramic sinters and the reduction of the voids is inhibited by the shrinkage of the ceramic. As a result, large voids are formed around the conductor. When voids are formed in the ceramic part, the withstand voltage of the ceramic substrate is lowered and the reliability of the circuit substrate cannot be maintained.

Thus, the low-temperature firable substrate produced with conventional silver-based conductive pastes have problems that deformation such as warpage and formation of voids around the conductors were caused in the firing step to cause the defective wiring or breaking of the wire.

To prevent the warping of the substrate, for example, Japanese Patent Laid-Open No. 60-24095 proposes the use of such materials for the glass ceramic substrate and metal conductor that the difference in the shrinkage percentage between them is slight. For reducing the difference in the shrinkage percentage between them, Japanese Patent Laid-Open No. 60-24095 discloses only a method wherein a powder of a glass ceramic material is added to the Ag paste and a method wherein two kinds of Ag particles each having a different particle diameter are mixed together. Japanese Patent Laid Open No. 294595 proposes that the shrinkage-completion temperature of the conductive paste be made higher than that of the green sheet. In this method, only the particle diameter in the conductive paste and the green sheet is changed.

As for the fine line printability in the wiring, the wire is broken when coarse particles are contained in the paste and, in addition, bleeding occurs after the completion of the printing and the printed pattern is ill-shaped when the particles are too fine. Thus, it has been impossible to solve the problem of warpage caused by firing while maintaining excellent printability.

In the descriptions on the conventional techniques of preventing the substrate from warping, description is given only on the functions in most cases. No technical characteristic effective in producing the actual ceramic circuit substrate, particularly multi-layer substrate, have been known.

SUMMARY OF THE INVENTION

Accordingly, an object of this invention is to eliminate the above-mentioned problems of the prior art and provide a silver-based conductive paste which is capable of preventing the substrate from warping during the course of sintering and usable for fine line printing for wiring, and a multilayer ceramic circuit substrate prepared using such a conductive paste.

After intensive investigations, the inventors have found that the above-described object of the invention can be attained by using a silver-based conductive paste having a specified composition and specified properties. In particular, the present invention has been completed on the basis of a finding that a conductive paste is effectively usable for forming a wiring conductor of an internal layer in a multi-layer ceramic circuit substrate produced by co-firing the green sheet and conductive paste at a low temperature.

Namely, the present invention provides the following silver-based conductive pastes and multi-layer ceramic circuit substrates (1) to (5):

(1) a silver-based electrically conductive paste used for printing on a green sheet of a low-temperature firable ceramic, comprising a $CaO$—$Al_2O_3$—$SiO_2$—$B_2O_3$—system glass and $Al_2O_3$, wherein a silver-based powder in the conductive paste has a specific surface area in the range of 0.1 to 0.5 $m^2/g$ and the formation of a scratch begins when the value measured with a grind gage for the paste containing an organic resin and an organic solvent is in the range of 30 to 10 μm, (2) a silver-based electrically conductive paste according to the above item 1, wherein the organic binder is ethylcellulose and/or hydroxyethylcellulose and the organic solvent is butylcarbitol acetate and/or terpineol, (3) a silver-based electrically conductive paste according to the above item 1, wherein the amounts of ethylcellulose and/or hydroxyethylcellulose and butylcarbitol acetate and/or terpineol are 1 to 7 parts by weight and 10 to 25 parts by weight, respectively, relative to 100 parts by weight of silver.

(4) a multilayer ceramic circuit substrate produced by printing a silver-based electrically conductive paste as a wiring conductor of an internal layer on green sheets of a low-temperature firable ceramic comprising a $CaO$—$Al_2O_3$—$SiO_2$—$B_2O_3$ glass and $Al_2O_3$ and co-firing the printed green sheets, the silver-based conductive paste comprising a silver-based powder having a specific surface area in the range of 0.1 to 0.5 $m^2/g$, ethylcellulose and/or hydroxyethylcellulose as an organic resin and butylcarbitol acetate and/or terpineol as an organic solvent so that the formation of a scratch begins when the value measured with a grind gage for the paste is in the range of 30 to 10 μm, and (5) a multilayer ceramic circuit substrate according to the above item 4, wherein the low-temperature firable ceramic comprises 50 to 65% by weight of a glass powder composed of 10 to 55% by weight of CaO, 30% by weight or below of $Al_2O_3$, 45 to 70% by weight of $SiO_2$ and 30% by weight or below of $B_2O_3$, and the balance of alumina.

The silver-based powder set forth in the above items may be either Ag alone or a mixture or an alloy consisting mainly of Ag and including, for example, Pd and/or Pt. Therefore, the silver-based conductive paste of the present invention may be any one of Ag, Ag-Pd, Ag-Pd-Pt or similar conductive pastes.

DETAILED DESCRIPTION OF THE PREFERRED EMBODIMENTS

A silver-based conductive paste capable of reducing the warping and formation of voids around the conductors and having excellent fine line printability can be obtained by the present invention. When the silver-based conductive paste of the present invention comprising the silver-based powder having a specific surface area in the range of 0.1 to 0.5 $m^2/g$, in which the formation of a scratch begins when the value measured with a grind gage for the paste is in the range of 30 to 10 μm, is used, the shrinkage percentage of the paste can be made closer to that of the ceramic, the shrinkage behavior thereof can also be made closer to that of the ceramic in the firing and excellent fine line properties can be secured.

As the specific surface area of the Ag-based powder becomes smaller, the shrinkage behavior thereof upon firing becomes closer to that of the ceramic. However, when the specific surface area thereof is less than 0.1 $m^2/g$, the discharge through the screen mesh is decreased in the fine line printing. When the specific surface area is more than 0.5 $m^2/g$, on the other hand, warping by firing becomes worse. As for the properties of the paste obtained by mixing the Ag-based powder with an organic vehicle, the fine line properties are impaired when the starting point of scratch or streak observed in the grind gage is greater than 30 μm, in other words, the fine line printability is impaired when the state of the Ag-based particles represented by the size of the secondary particles in the paste is too large (greater than 30 μm), even when the specific surface area of the Ag-based particles is in the above-described range of 0.1 to 0.5 $m^2/g$. On the other hand, when the gage valve at which a scratch or streak starts is too small (smaller than 10 μm, the fluidity of the paste in the printing step is low which makes the cross section of the print pattern semicircular and also makes short circuiting easy to occur between the wires in the course of the fine line printing. Further, when the secondary particles in the paste are too fine, warpage is caused by the firing. The measurement of the secondary particles is made by observing the scratch or streak with the grind gage. Through such a measurement, an ideal, rectangular shape of the Ag cross section can be obtained after the printing.

Figure 2:
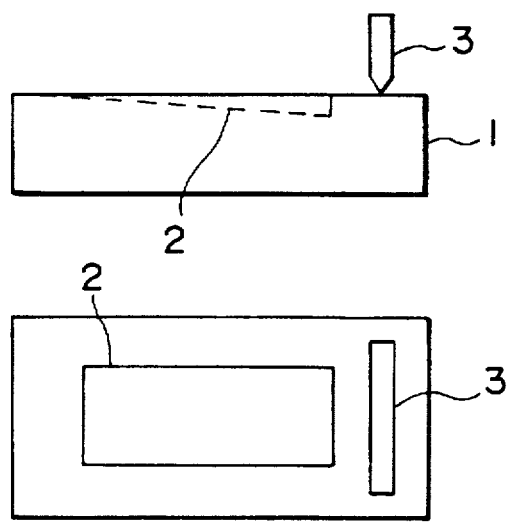
FIG. 2 is a schematic view of an important part of a grind gage and FIGS. 3 (a) and (b) are the outline showing how to measure using the grind gage shown in FIG. 2.
Figure 3A:
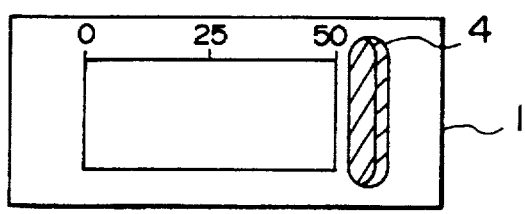
Figure 3B:
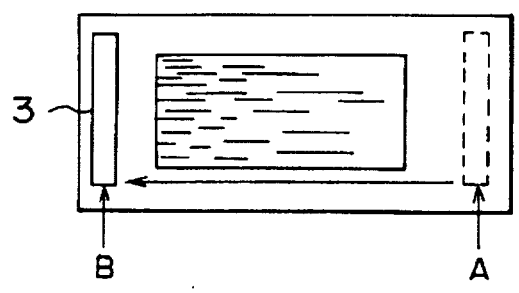

The measurement with a grind gage are explained with reference to FIGS. 2 and 3(a) and 3(b). The grind gage is a measuring gage used for measuring the size of particles (i.e., secondary particle size) included in a paste. As shown in FIG. 2, the gage comprises a metal plate (main body) 1 provided with a groove 2 having a graduated depth, and a metal scraper 3 having a larger width than that of the groove 2. The numerical values in FIG. 3(a) are shown in μm. In the measurement, a sample paste 4 is placed at the deepest end of the groove 2, as shown in FIG. 2, pressed against the main body 1 with the scraper 3 and moved with the same from the deeper side A to shallower side of the groove 2, as shown in FIG. 3(b), to measure the groove depth at which the occurrence of the first scratch is observed. The maximum size of the secondary particles in the paste can be obtained from the graduated depth at the starting point of scratch.

The term "the value measured with the grind gage" herein indicates the depth of the groove at the location of the first scratch formed when horizontally scratching the paste on the plate having a groove with a depth of 50 μm at an end and 0 μm at the other end .

The organic resin used herein is ethylcellulose and/or ethylhydroxycellulose, and the organic solvent is butylcarbitol acetate and/or terpineol. Through the combination of them, excellent printability, which is an important characteristic of the conductive paste, can be obtained.

Figure 1:
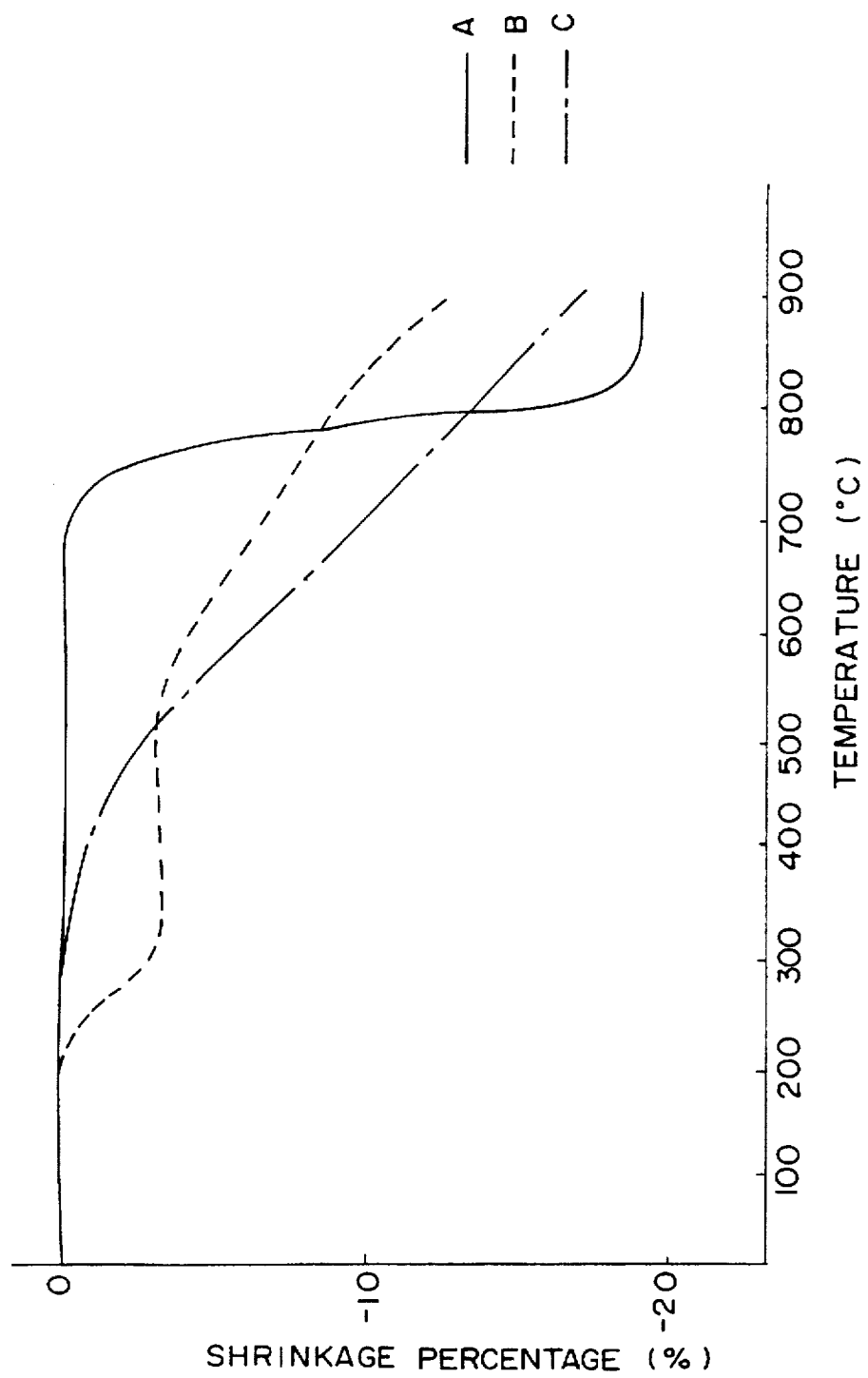
FIG. 1 is a graph showing the relationship between the firing temperature and the shrinkage percentage for a green sheet for a low-temperature firable ceramic substrate, a conventional silver-based conductive paste and a silver-based conductive paste of the present invention.

The relationship between the shrinkage percentage and firing temperature is shown in FIG. 1. When, for example, LFC as the low-temperature firable ceramic substrate is heated and the curve of shrinkage by firing is formed by the TMA method or the print disc shrinkage method, an change shown by a curve A in FIG. 1 is obtained. The shrinkage rapidly starts at about 730° C. and a shrinkage curve with a maximum shrinkage of 19% is drawn at the time of the completion of the firing. The heating process can be divided into an initial period in which the temperature is 250° to 430° C. and a latter period in which the temperature is 430° to 500° C.

In the firing of the conductive paste, problems such as warpage are ideally not caused when the shrinkage curve of the paste is the same as that of the green sheet for the low-temperature firable ceramic substrate. On the other hand, the conventional silver-based conductive paste begins to shrink at around 230° C. as shown by curve B in FIG. 1. However, when the conductor begins to shrink at 250° to 430° C. in the initial period of the low-temperature firable substrate, the substrate cannot absorb the shrinkage of the conductor,which causes serious warpage. This is the cause of the warpage and distortion which occurs when the conventional silver-based conductive paste is used.

Thus, when the conductive paste of the present invention begins to shrink in the latter period of removing the binder or, specifically at a temperature of 430° C. or above, preferably at 450° C. or above, for the low-temperature firable substrate, the distortion thus caused can be absorbed by the substrate and the substrate does not warp. In other words, although the low-temperature firable substrate can be resistant to the distortion of the conductive paste caused at a temperature range of 430° C. or above, in the latter period of removing the binder, it is not resistant to the distortion of the conductive paste in the initial period thereof which causes the warping of the substrate.

The curve C in FIG. 1 shows the change of the silver-based conductive paste of the present invention. By using the silver-based conductive paste of the present invention, the temperature at which shrinkage starts can be made higher than that of conventional pastes and, as a result, the warping of the substrate can be reduced to 20 μm or below per inch by laminating a plurality of the green sheets printed with the conductive paste of the present invention, compressing the laminate to make it into one body and firing the body.

The organic vehicle for the silver-based conductive paste of the present invention is composed of ethylcellulose and/or hydroxyethylcellulose as the resin component and butylcarbitol acetate and/or terpineol as the solvent component in order to impart printability to the paste.

The low-temperature firable ceramic substrate used in the present invention is produced by mixing a mixture of 50 to 65% by weight of a $CaO$—$Al_2O_3$—$SiO_2$—$B_2O_3$ glass powder, such as a glass powder composed of 10 to 55% by weight of CaO, 30% by weight or below of $Al_2O_3$, 45 to 70% by weight of $SiO_2$ and 30% by weight or below of $B_2O_3$, and the balance of α—$Al_2O_3$ powder with the above-described binder and the solvent in a ball mill and obtaining a low-temperature firable green sheet with a uniform thickness of 0.3 mm by an ordinary doctor blade process.

In the production of the multilayer ceramic substrate of the present invention, a green sheet laminating process wherein a green sheet is used is employed. For example, a ceramic insulating material powder is cast by the doctor blade process to obtain a green sheet having a thickness of about 0.1 to 0.5 mm. Then a necessary wiring pattern is printed with the Ag, Ag-Pd, Ag-Pt, Ag-Pd-Pt or similar Ag-based conductive paste of the present invention by the screen printing technique. Through holes having about 0.3 to 2.0 mm diameter are formed in the green sheet with a punching die or punching machine so that the sheet can be connected with another conductive layer. When no pins or leads are inserted into the wiring via holes, the holes are filled with the conductive Ag-based material of the present invention or a conventional conductive Ag-based material. The wiring patterns necessary for forming the circuit are printed on other green sheets in the same manner as described above. These green sheets were accurately laminated by utilizing the positioning holes, and the laminate is hot pressed at 80° to 150° C. under 50 to 250 kg/cm² to obtain an integrated structure.

The following Examples and Comparative Examples will further illustrate the present invention.

EXAMPLE 1

A solvent (toluene or xylene), an organic resin (acrylic resin) and a plasticizer (DOP) were added to a mixed ceramic insulating powder comprising 60% of a glass powder composed of CaO, $Al_2O_3$, $SiO_2$ and $B_2O_3$ and having an average particle diameter of 3 to 3.5 μm, which was produced by melting the components at 1450° C., quenching the molten product in water and pulverizing the product, and 40% of an alumina powder having an average particle diameter of 1.2 μm. The resultant mixture was thoroughly kneaded to obtain a slurry having a viscosity of 2,000 to 40,000 cps, from which a green sheet having a thickness of 0.4 mm was cast by an ordinary doctor blade process.

The green sheet was cut into squares of 30 mm×30 mm. Separately, an organic resin (ethylcellulose) and a solvent (terpineol) were added to the Ag powder and the resultant mixture was thoroughly kneaded to obtain a conductive Ag paste (A). An Ag wiring pattern was printed with the paste (A). Green sheets having the wiring pattern printed in the same manner as that described above were laminated and the laminate was hot-pressed at 100° C. under 100 kg/cm² to obtain an integrated structure.

The product was fired with an ordinary electric continuous belt furnace under conditions of 900° C. for a holding time of 20 min in an oxidizing atmosphere. The warpage in the conductors and the presence or absence of voids around the conductor in internal layers are given in Table 2.

EXAMPLES 2 to 4

Pastes (B), (C) and (D) comprising a silver powder, an organic resin and an organic solvent shown in Table 1 were prepared and then green sheets were fired under the same conditions as those of Example 1 except that these pastes were used. The results are given in Table 2.

COMPARATIVE EXAMPLES 1 to 3

For comparison, pastes (E) and (F) given in Table 1 were prepared and green sheets were fired under the same conditions as those of Example 1 except that these pastes were used. In Comparative Example 3, a paste (G) was prepared by conducting the mixing with a triple roll mill for a long time. The results are also given in Table 2.

In Examples 1 to 4, the maximum amount of warpage in a part of 10 mm×10 mm as the internal layer conductor was determined as the warpage after the firing. The results of the examination of voids are given in terms of the presence or absence of voids around the conductor of 10 mm×10 mm. As for the fine line properties, a pattern having a wire width of 80 μm, wiring distance of 80 μm and wiring pitch of 160 μm was printed, and the presence or absence of broken parts or shorts in the wiring was examined.

The examination results indicated that the warpage in the conductor part was sufficiently small and no void was found around any of the internal layer conductors in Examples 1 to 4. The fine line properties of the wiring in the printing step were also excellent. On the other hand, the amount of warpage was as large as 0.3 mm or above in Comparative Examples 1 and 3, and voids were recognized around the conductor in Comparative Example 1. In Comparative Examples 2 and 3, breaking of the wire and shorts were caused.

TABLE 1

| | | Silver powder | | Paste composition parts by weight** | |
|---|---|---|---|---|---|
| Test No. | Paste No. | specific surface area (m²/g) | scratch in grind gage* (μm) | organic resin | organic solvent |
| Ex. 1 | A | 0.32 | 20 | ethylcellulose 5 | terpineol 18.0 |
| Ex. 2 | B | 0.18 | 28 | hydroxyethyl-cellulose 1.5 | butylcarbitol acetate 17.0 |
| Ex. 3 | C | 0.25 | 21 | ethylcellulose 3 | butylcarbitol acetate 10.0 terpineol 6.3 |
| Ex. 4 | D | 0.46 | 12 | hydroxyethyl-cellulose 2 | butylcarbitol acetate 23.0 |
| Comp. Ex. 1 | E | 1.02 | 18 | ethylcellulose 5 | terpineol 21.3 |
| Comp. Ex. 2 | F | 0.22 | 40 | ethylcellulose 4 | butyicarbitol acetate 20.4 |
| Comp. Ex. 3 | G | 0.40 | 9 | ethylcellulose 3 | terpineol 23.0 |

*The depth of a groove of a grind gage at which the formation of the first scratch began for each sample paste.

TABLE 2

| Test No. | Paste No. | Warp in conductor part (mm/10 mm × 10 mm) | Voids around internal layer conductor | Fine line properties |
|---|---|---|---|---|
| Ex. 1 | A | 0.02 | none | o |
| Ex. 2 | B | 0.005 | none | o |
| Ex. 3 | C | 0.015 | none | o |

TABLE 2-continued

| Test No. | Paste No. | Warp in conductor part (mm/10 mm × 10 mm) | Voids around internal layer conductor | Fine line properties |
|---|---|---|---|---|
| Ex. 4 | D | 0.025 | none | o |
| Comp. Ex. 1 | E | 0.35 | found | o |
| Comp. Ex. 2 | F | 0.02 | none | x (breaking of wire) |
| Comp. Ex. 3 | G | 2.74 | none | x (shortcut) |

As described above, the ceramic circuit substrate produced using the silver-based electrically conductive paste of the present invention has only a very slight warpage fine line printing of wiring is possible thereon.

What is claimed is:

1. A silver-based electrically conductive paste used for printing on green sheets of a low-temperature firable ceramic, the green sheets comprising a CaO—Al$_2$O$_3$—SiO$_2$—B$_2$O$_3$—system glass and Al$_2$O$_3$, wherein the silver-based component in the conductive paste consists of a powder having a specific surface area in the range of 0.1 to 0.5 m$^2$/g and the formation of a scratch begins when the value measured with a grind gage for the paste containing an organic resin and an organic solvent is in the range of 30 to 10 μm.

2. The silver-based electrically conductive paste according to claim 1, wherein the organic resin is at least one of ethylcellulose and hydroxyethylcellulose and the organic solvent is at least one of butylcarbitol acetate and terpineol.

3. The silver-based electrically conductive paste according to claim 2, wherein the amounts of the at least one of ethylcellulose and hydroxyethylcellulose and the at least one of butylcarbitol acetate and terpineol are 1 to 7 parts by weight and 10 to 25 parts by weight, respectively, relative to 100 parts by weight of silver.

4. The silver-based electrically conductive paste according to claim 1, wherein the silver-based component is composed of Ag or an alloy consisting of Ag and including at least one of Pd and Pt.

* * * * *